(12) United States Patent
Song et al.

(10) Patent No.: US 11,569,475 B2
(45) Date of Patent: Jan. 31, 2023

(54) DISPLAY DEVICE AND METHOD OF MANUFACTURING THE SAME

(71) Applicants: SAMSUNG DISPLAY CO., LTD., Yongin-si (KR); IUCF-HYU (Industry-University Cooperation Foundation Hanyang University), Seoul (KR)

(72) Inventors: Seungyong Song, Yongin-si (KR); Hyojeong Kwon, Yongin-si (KR); Seunghun Kim, Yongin-si (KR); Myungmo Sung, Seoul (KR); Kwanhyuck Yoon, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 30 days.

(21) Appl. No.: 16/676,816

(22) Filed: Nov. 7, 2019

(65) Prior Publication Data
US 2020/0075890 A1 Mar. 5, 2020

Related U.S. Application Data

(63) Continuation of application No. 15/856,793, filed on Dec. 28, 2017, now Pat. No. 10,505,148, which is a continuation of application No. 15/198,854, filed on Jun. 30, 2016, now Pat. No. 9,893,315.

(30) Foreign Application Priority Data

Nov. 3, 2015 (KR) .......................... 10-2015-0153808

(51) Int. Cl.
  *H01L 51/52* (2006.01)
  *H01L 51/56* (2006.01)
  *H01L 27/32* (2006.01)

(52) U.S. Cl.
  CPC .......... *H01L 51/5253* (2013.01); *H01L 51/56* (2013.01); *H01L 27/3244* (2013.01)

(58) Field of Classification Search
  CPC . H01L 51/5253; H01L 51/56; H01L 27/3244; H01L 33/57
  See application file for complete search history.

(56) References Cited

U.S. PATENT DOCUMENTS

| 9,070,898 | B2 | 6/2015 | Kim |
| 9,893,315 | B2 | 2/2018 | Song et al. |
| 2003/0203210 | A1 | 10/2003 | Graff et al. |
| 2004/0209126 | A1 | 10/2004 | Ziegler et al. |

(Continued)

FOREIGN PATENT DOCUMENTS

| JP | 2008-305557 | 12/2008 |
| KR | 10-2004-0099800 | 12/2004 |

(Continued)

*Primary Examiner* — Yu-Hsi D Sun
(74) *Attorney, Agent, or Firm* — F. Chau & Associates, LLC

(57) ABSTRACT

A display device includes a display device including a substrate, and a display unit disposed on the substrate. An encapsulating unit encapsulates the display unit. The encapsulating unit includes a barrier organic layer. The barrier organic layer includes a plurality of organic materials and a plurality of inorganic materials. The inorganic materials are arranged in free volumes between the organic materials.

20 Claims, 9 Drawing Sheets

(56) References Cited

U.S. PATENT DOCUMENTS

| | | |
|---|---|---|
| 2004/0234813 A1 | 11/2004 | Lee et al. |
| 2007/0196939 A1* | 8/2007 | Park .................. H01L 33/54 |
| | | 438/22 |
| 2008/0305360 A1 | 12/2008 | Han et al. |
| 2012/0133275 A1 | 5/2012 | Lee et al. |
| 2014/0065739 A1 | 3/2014 | Chen et al. |
| 2014/0179041 A1* | 6/2014 | Huh .................. H01L 51/5253 |
| | | 438/28 |
| 2014/0190565 A1 | 7/2014 | Jung et al. |
| 2014/0231767 A1 | 8/2014 | Tsai et al. |
| 2014/0246685 A1 | 9/2014 | Miura et al. |
| 2014/0361263 A1* | 12/2014 | Kim .................. H01L 51/5253 |
| | | 257/40 |
| 2015/0021565 A1* | 1/2015 | Min .................. H01L 51/5256 |
| | | 257/40 |
| 2015/0034916 A1 | 2/2015 | Lee et al. |
| 2015/0168776 A1 | 6/2015 | Song et al. |
| 2016/0072100 A1 | 3/2016 | Tsai et al. |
| 2016/0190503 A1* | 6/2016 | Chang .................. H01L 51/5256 |
| | | 257/40 |
| 2016/0254479 A1* | 9/2016 | Jeong .................. H01L 51/5246 |
| | | 257/40 |
| 2016/0258060 A1* | 9/2016 | Huh .................. C23C 16/455 |
| 2017/0077195 A1 | 3/2017 | Seo et al. |
| 2017/0125730 A1 | 5/2017 | Song et al. |
| 2017/0148856 A1 | 5/2017 | Choi et al. |
| 2018/0145279 A1 | 5/2018 | Song et al. |

FOREIGN PATENT DOCUMENTS

| | | |
|---|---|---|
| KR | 10-2008-0107220 | 12/2008 |
| KR | 10-2009-0074997 | 7/2009 |
| KR | 10-2012-0057286 | 6/2012 |
| KR | 10-2014-0092268 | 7/2014 |
| KR | 10-2015-0026747 | 3/2015 |
| KR | 10-2015-0052244 | 5/2015 |
| KR | 10-2015-0062369 | 6/2015 |
| KR | 10-2015-0078246 | 7/2015 |

* cited by examiner

DISPLAY DEVICE AND METHOD OF MANUFACTURING THE SAME

CROSS-REFERENCE TO RELATED APPLICATIONS

This application is a continuation of U.S. patent application Ser. No. 15/856,793, filed Dec. 28, 2017, which is a continuation of U.S. patent application Ser. No. 15/198,854, filed on Jun. 30, 2016, which claims priority under 35 U.S.C. § 119 to Korean Patent Application No. 10-2015-0153808, filed on Nov. 3, 2015, in the Korean Intellectual Property Office, the disclosures of which are incorporated by reference herein in their entireties.

TECHNICAL FIELD

Exemplary embodiments of the present invention relate to a display device, and more particularly to a method of manufacturing the same.

DISCUSSION OF RELATED ART

Utilization of display apparatuses such as a liquid crystal display (LCD), an organic light emitting diode display (OLED), an electro phoretic display (EPD) and a plasma display panel (PDP) has increased.

Flat panel displays may include flexible display panels capable of being bendable or foldable in various directions. Various methods have been presented for increasing the flex of flexible display panels.

Protection of elements of flexible display panels from outside moisture or oxygen may be insufficient when the number of encapsulating thin films is reduced to obtain a smaller thickness, and the flexibility may be lowered when the thickness is increased for the protection of elements.

When an inorganic layer is included in a thin film encapsulation layer, reduced flexibility may result in a stress concentration in a particular area and thus a crack may occur when the inorganic layer deforms.

SUMMARY

One or more exemplary embodiments of the present invention ma include a display device including a substrate, and a display unit disposed on the substrate. An encapsulating unit encapsulates the display unit. The encapsulating unit includes a barrier organic layer. The barrier organic layer includes a plurality of organic materials and a plurality of inorganic materials. The inorganic materials are arranged in free volumes between the organic materials.

According to one or more exemplary embodiments, the barrier organic layer may include a non-slippery top surface.

According to one or more exemplary embodiments of the present invention, the encapsulating unit may have a multilayered structure. The encapsulating unit may include a first inorganic layer disposed on the barrier organic layer.

According to one or more exemplary embodiments of the present invention, the encapsulating unit may include an encapsulating substrate and an encapsulating material. The barrier organic layer may include the encapsulating material.

Exemplary embodiments of the present invention include a method of manufacturing a display device including preparing a substrate and forming a display unit on the substrate. An encapsulating unit encapsulating the display unit is formed. Forming the encapsulating unit includes forming a barrier organic layer. The barrier organic layer includes a plurality of organic materials and a plurality of inorganic materials. The inorganic materials are arranged in free volumes between the organic materials.

According to one or more exemplary embodiments of the present invention, the forming the barrier organic layer may include forming an organic layer and injecting a plurality of inorganic precursors into free volumes existing between the plurality of organic materials composing the organic layer.

According to one or more exemplary embodiments of the present invention, the forming the barrier organic layer may include adding a reactant to free volumes between the plurality of organic materials after having injected the inorganic precursors into the free volumes.

According to one or more exemplary embodiments of the present invention, the forming the barrier organic layer may include converting the inorganic precursors to inorganic materials in the free volumes by adding the reactant.

According to one or more exemplary embodiments of the present invention, the forming the encapsulating unit may include forming the first inorganic layer encapsulating the display unit before forming the barrier organic layer.

According to one or more exemplary embodiments of the present invention, a top surface of the barrier organic layer may be rough.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION

Figure 1:
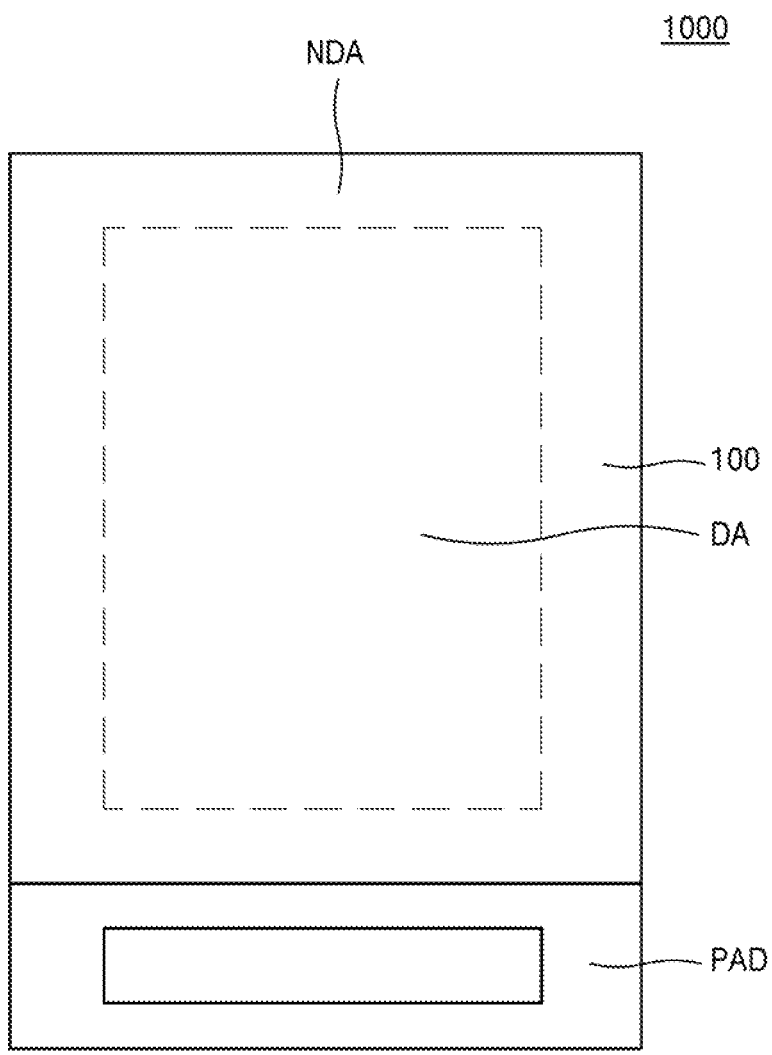
FIG. 1 is a plan view of a display device according to one or more exemplary embodiments of the present invention.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals in the specification and drawings may denote like elements.

It will be understood that although the terms "first" and "second" may be used herein to describe various components, these components should not be limited by these terms.

It will be understood that when a layer, region, or component is referred to as being "formed on" another layer, region, or component, it may be directly or indirectly formed on the other layer, region, or component. For example, intervening layers, regions, or components may be present.

Sizes of components in the drawings may be exaggerated for clarity.

When a certain embodiment may be implemented differently, a specific process order may be performed differently from the described order. For example, two consecutively described processes may be performed substantially at the same time or performed in an order opposite to the described order.

FIG. 1 is a plan view of a display device according to one or more exemplary embodiments of the present invention.

A substrate 100 may include one or more flexible materials. The substrate 100 may include one or more relatively heat-resistant and durable plastic materials.

The substrate 100 may include a display area (DA) displaying images, and a non-display area (NDA), which may be an area outside the display area (DA).

Various elements, emitting light, such as an organic light emitting element and a liquid crystal display element may be included in the display area (DA), and voltage lines supplying electrical power may be arranged in the non-display area (NDA).

The non-display area (NDA) may include a pad unit (PAD) which may transfer electrical signals from a power supply or a signal generator to the display area (DA).

The pad unit (PAD) may include a driver IC, a pad connecting the driver IC and pixel circuits, and a fan-out wiring.

Figure 2:
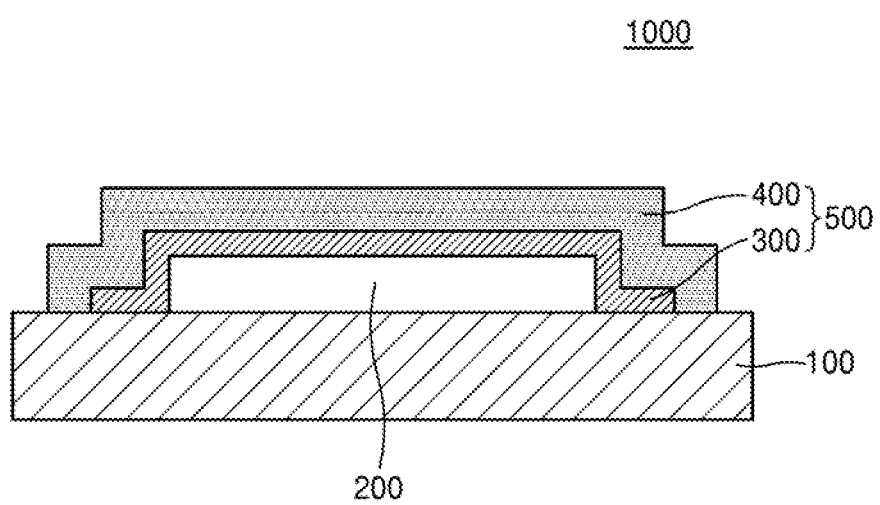
FIG. 2 is a cross-sectional view of the display device illustrated in FIG. 1.

FIG. 2 is a cross-sectional view of the display device illustrated in FIG. 1.

A display device 1000 may include the substrate 100, a display unit 200 disposed on the substrate 100, and an encapsulating unit 500 encapsulating the display unit 200 according to one or more exemplary embodiments of the present invention.

The substrate 100 may include one or more materials, as described above. The substrate 100 may include transparent glass materials including $SiO_2$ as a main component of the substrate 100. However, exemplary embodiments of the present invention are not limited thereto, and the substrate 100 may include transparent plastic materials. Plastic materials may be organic materials selected from insulating organic materials such as polyethersulphone (PES), polyacrylate (PAR), polyetherimide (PEI), polyethylene napthalate (PEN), polyethylene terephthalate (PET), polypheylene sulfide (PPS), polyallylate, polyimide, polycarbonate (PC), cellulose triacetate (TAC), and cellulose acetate propionate (CAP).

The display device 1000 may include the substrate 100 having a flexible property and thus, may be capable of two-dimensional elongation according to one or more exemplary embodiments of the present invention.

The substrate 100 may include one or more materials having a Poisson's ratio of about 0.4 or more according to an exemplary embodiment of the present invention. The Poisson's ratio denotes the ratio of transverse contraction strain to longitudinal extension strain in the direction of stretching force.

The flexibility of the substrate 100 may be increased and thus the display device 1000 may be more easily bendable or foldable when the substrate 100 includes materials that have the Poisson's ratio of about 0.4 or more. That is, the substrate 100 may have a relatively high stretching property.

The display unit 200 may be disposed on the substrate 100.

The display unit 200 may emit visible light which may be used to display images. The display unit 200 may include various elements, for example, an organic light emitting diode or a liquid crystal display element.

The display device 1000 may include the display unit 200 including an organic light emitting diode (OLED) according to one or more exemplary embodiments of the present invention. The OLED will be described in more detail below.

The display device 1000 may include the encapsulating unit 500, which may encapsulate the display unit 200 completely to protect the display unit 200 from outside moisture or oxygen.

The encapsulating unit 500 may be disposed on the display unit 200 and both ends of the encapsulating unit 500 may be in contact with the substrate 100.

The encapsulating unit 500 may include laminated thin film layers disposed on the display unit 200.

However, a shape of the encapsulating unit 500 is not limited thereto, and the encapsulating unit 500 may have a frit structure, instead of the thin film structure, and may protect the display unit 200 from outside oxygen or moisture.

The encapsulating unit 500 may include a first inorganic layer 300 and a barrier organic layer 400.

The first inorganic layer 300 may reduce or prevent an invasion of oxygen or moisture.

The first inorganic layer 300 may include a single layer or multiple layers which may include metal oxides or metal nitrides. The inorganic layers may each include any one of SiNx, $Al_2O_3$, $SiO_2$, and $TiO_2$.

The barrier organic layer 400 may compensate for a reduction in flexibility in the first inorganic layer 300. The barrier organic layer 400 may absorb stress in the first inorganic layer 300 and may provide flexibility to the encapsulating unit 500. Thus, the flexibility of the display device 1000 may be increased by the barrier organic layer 400 included in the encapsulating unit 500.

The barrier organic layer 400 may be a layer including both organic and inorganic materials. A process of forming the barrier organic layer 400 will be described in more detail below.

The organic material included in the barrier organic layer 400 may include a polymer. The barrier organic layer 400 may include a single layer or multiple layers, which may each include any one of PET, polyimide, PC, epoxy, polyethylene, and PAR.

For example, the organic material of the barrier organic layer 400 may include PAR. The barrier organic layer 400 may include a polymerized monomer composition including a diacrylate monomer and a triacrylate monomer. The monomer composition may include a monoacrylate monomer. The monomer composition may include a photoinitiator such as thermoplastic olefin (TPO); however, exemplary embodiments of the present invention are not limited thereto.

The top surface of the barrier organic layer 400 may be a rough surface. The barrier organic layer 400 included in the display device 1000 according to one or more exemplary embodiments of the present invention may include both organic materials and inorganic materials and thus, the top surface of the barrier organic layer 400 may be rough or rugged.

The top surface of the barrier organic layer 400 may be flat or smooth; however, exemplary embodiments of the present invention are not limited thereto, and the top surface of the barrier organic layer 400 may be non-slippery, rough and rugged.

The barrier organic layer 400 may provide flexibility and may also reduce or prevent the invasion of oxygen or moisture. For example, an organic layer included in the barrier organic layer 400 may provide flexibility and an inorganic layer included in the barrier organic layer 400 may reduce or prevent the invasion of oxygen or moisture. The display device 1000 according to one or more exemplary embodiments of the present invention may include the barrier organic layer 400, which may be a single thin film, or which may include inorganic and organic layers.

Thus, the display device 1000 according to one or more exemplary embodiments of the present invention need not include an additional inorganic layer on the barrier organic layer 400 to protect the display unit 200 from oxygen or moisture.

The encapsulating unit 500 may include two thin films, that is, the first inorganic layer 300 and the barrier organic layer 400. Thus, the encapsulating layer 500 may be relatively thin and may have increased flexibility.

Since the first inorganic layer 300 may be included in the encapsulating unit 500, a reduction in the flexibility of the first inorganic layer 300 may be reduced or prevented and an occurrence of a crack due to a concentration of stress in the first inorganic layer 300 may be reduced or prevented.

Figure 3:
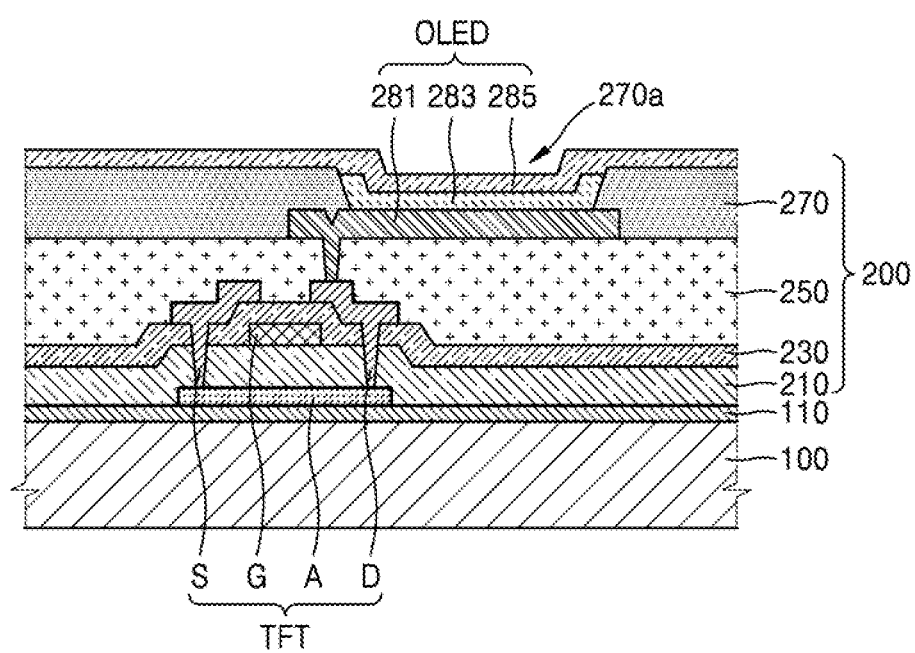
FIG. 3 is an enlarged cross-sectional view of the display device illustrated in FIG. 2, showing a display unit of the display device.

FIG. 3 is an enlarged cross-sectional view of the display device illustrated in FIG. 2, showing a display unit of the display device. The display unit 200 may include various light emitting elements such as the OLED and the liquid crystal display element; however, exemplary embodiments of the preset invention are not limited thereto.

A buffer layer 110 may be disposed on the substrate 100. The buffer layer 110 may reduce or prevent a dispersion of ions of impurities, may reduce or prevent an invasion of moisture or outside air, and may be a barrier layer and/or a blocking layer that flattens a surface of the substrate 100.

The butler layer 110 may include the inorganic layer and may be disposed on substantially the entire top surface of the substrate 100.

A thin film transistor (TFT) may be disposed on the butler layer 110. An active layer A of the TFT may include polysilicon and may include a channel region which is not doped with impurities. A source region and a drain region may be respectively disposed on sides of the channel region and may each be doped with impurities. The impurities may vary depending on a type of TFT and may include n-type impurities or p-type impurities.

A gate insulating layer 210 may be disposed on the active layer A. The gate insulating layer 210 may be formed after the active layer A has been formed.

The gate insulating layer 210 may include inorganic materials such as silicon oxides and silicon nitrides, and may include multiple layers or a single layer. The gate insulating layer 210 may insulate the active layer A from a gate electrode G disposed on the gate insulating layer 210.

The gate insulating layer 210 may include the inorganic layer, and may be disposed on substantially the entire surface of the substrate 100.

The gate electrode G may be disposed on the gate insulating layer 210. The gate electrode G may be formed after the gate insulating layer 210 has been formed. The gate electrode G may be formed via a photolithography process and an etching process.

The gate electrode G may include at least one metal selected from Mo, Al, Pt, Pd, Ag, Mg, Au, Ni, Nd, Ir, Cr, Li, Ca, Ti, W, and Cu.

An interlayer insulating layer 230 may be disposed on substantially the entire surface of the substrate 100 and may cover the gate electrode G. The interlayer insulating layer 230 may be formed after the gate electrode has been formed.

The interlayer insulating layer 230 may include inorganic materials. For example, the interlayer insulating layer 230 may include metal oxides or metal nitrides. The inorganic materials may include $SiO_2$, $Si_x$, $SiON$, $Al_2O_3$, $TiO_2$, $Ta_2O_5$, $HfO_2$, or $ZrO_2$.

The interlayer insulating layer 230 may include inorganic materials such as silicon oxides ($SiO_x$) and/or silicon nitrides $SiN_x$, and may include multiple layers or a single layer. In some exemplary embodiments of the present invention, the interlayer insulating layer 230 may have a dual layer structure of SiOx/SiNy or SiNx/SiOy.

A source electrode S and a drain electrode D of the TFT may be disposed on the interlayer insulating layer 230.

The source electrode S and the drain electrode D may include at least one metal selected from Al, Pt, Pd, Ag, Mg, Au, Ni, Nd, Ir, Cr, Li, Ca, Mo, Ti, W and Cu.

A via layer 250 may cover the source electrode S and the drain electrode D. A first electrode 281 may be disposed on the via layer 250. The first electrode 281 may be connected to the drain electrode D through a via hole formed in the via layer 250 according to an exemplary embodiment of the present invention.

The via layer 250 may include one or more insulating materials. For example, the via layer 250 may include inorganic materials, organic materials or a combination of organic/inorganic materials, and may include a monolayer or multiple layers. The via layer 250 may be formed via various deposition methods. In some exemplary embodiments of the present invention, the via layer 250 may include at least one of polyacrylic resin, epoxy resin, phenolic resin, polyamide-based resin, polyimide-based resin, unsaturated polyester-based resin, polyphenylene-based resin, polyphenylene sulfides-based resin and benzocyclobutene (BCB).

The OLED may be disposed on the via layer 250.

The OLED may include the first electrode 281, an intermediate layer 283 including an organic light emitting layer and a second electrode 285. The display device 1000 may include a pixel defining layer 270 including an opening 270a.

Holes and electrons injected from the first electrode 281 and the second electrode 285 of the OLED may combine in the organic light emitting layer of the intermediate layer 283 and generate light. The intermediate layer 283 may be disposed inside the opening 270a, and thus the opening 270a may act as a pixel region.

The first electrode 281 and/or the second electrode 285 may include a transparent electrode or a reflective electrode. When the first and/or second electrode 281 and 285 include the transparent electrode, the transparent electrode may include ITO, IZO, ZnO or $In_2O_3$. When the first and/or second electrode 281 and 285 include the reflective electrode, the reflective electrode may include a reflective layer including Ag, Mg, Al, Pt, Pd, Au, Ni, Nd, Ir and Cr, or a compound of these metals, and a transparent layer including ITO, IZO, ZnO or $In_2O_3$. In some exemplary embodiments of the present invention, the first electrode 281 or the second electrode 285 may have a structure of ITO/Ag/ITO.

The intermediate layer 283 may be disposed between the first electrode 281 and the second electrode 285, and may include the organic light emitting layer.

The intermediate layer 283 may include the organic light emitting layer and may include at least one of a hole injection layer (HIL), a hole transport layer, an electron transport layer and an electron injection layer. However, exemplary embodiments of the present invention are not limited thereto and the intermediate layer 283 may include the organic light emitting layer and may include other various functional layers. A spacer may be disposed on the pixel defining layer 270. The spacer may protrude in an upward direction from the pixel defining layer 270 and may reduce or prevent a reduction in display characteristics due to an outside impact.

FIGS. 4A through 4D are cross-sectional views illustrating a method of manufacturing a display device, according to one or more exemplary embodiments of the present invention.

Figure 4A:
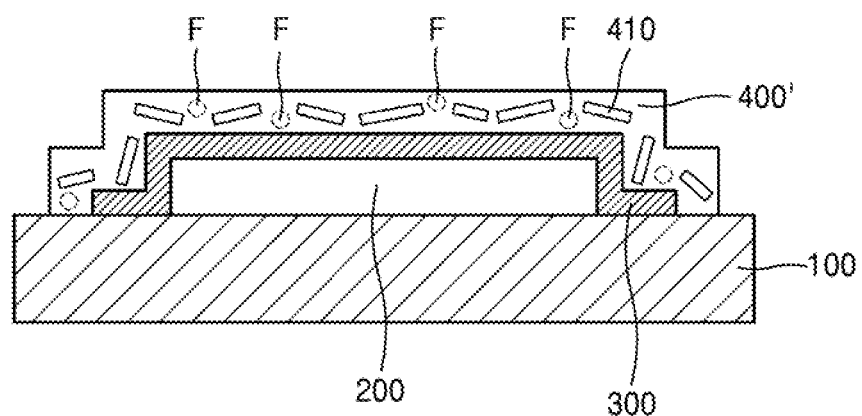
FIGS. 4A through 4D are cross-sectional views illustrating a method of manufacturing a display device, according to one or more exemplary embodiments of the present invention.

Referring to FIG. 4A, the substrate 100 may be prepared and a display unit 200 may be formed on the substrate 100.

The first inorganic layer 300 may protect the display unit 200 from outside moisture or oxygen. The first inorganic layer 300 may have a thin film shape and may be formed on the display unit 200 to encapsulate completely the display unit 200. Both ends of the first inorganic layer 300 may be formed to be in contact with the substrate 100.

The first inorganic layer 300 may include a single layer or multiple layers including metal oxides or metal nitrides. The inorganic layers may include any one of SiNx, $Al_2O_3$, $SiO_2$, and $TiO_2$.

An organic layer 400' may be formed on the first inorganic layer 300 after the first inorganic layer 300 has been formed.

The organic layer 400' may include organic materials 410. The organic material 410 may include a polymer. The organic material 410 may include any one of PET, polyimide, PC, epoxy, polyethylene and PAR.

The organic material 410 may include a polymerized monomer composition including diacrylate monomer and triacrylate monomer.

Each of a plurality of organic materials 410 may have a stick shape; however, exemplary embodiments of the present invention are not limited thereto. The organic material 410 may have a chain shape or any other shape in another exemplary embodiment of the present invention.

Since the plurality of organic materials 410 forming the organic layer 400' may have a chain shape with a certain length, a free volume F may exist between the organic materials 410.

The organic layer 400' may include a plurality of organic materials with a certain gap between each other, and thus the free volume F may exist between the organic materials 410.

The plurality of organic materials 410 are illustrated and the plurality of free volumes F between the plurality of organic materials 410 are illustrated as dotted lines in FIG. 4A; however, the number, occurrence, locations or sizes of the free volumes are not limited thereto.

The free volume F may provide invasion paths for outside moisture or oxygen, through the organic layer 400' to the display unit 200, despite a flexible characteristic of the organic layer 400'.

Figure 4B:
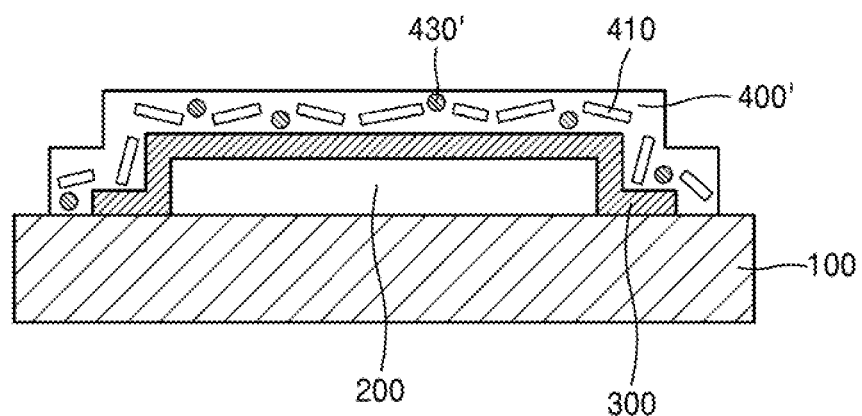

Thus, a method of manufacturing the display device according to one or more exemplary embodiments of the present invention may perform an operation of injecting an inorganic precursor 430' into the free volumes F after the organic layer 400' has been formed, as illustrated in FIG. 4B, for example.

The inorganic precursor 430' may be changed to the inorganic material by a subsequent reaction with a reactant, and thus may use any material which is capable of filling in free volumes F.

The inorganic precursor 430' may be trimethylaluminum (TMA, $[(CH_3)_3Al]_2$) according to an exemplary embodiment of the present invention.

Figure 4C:
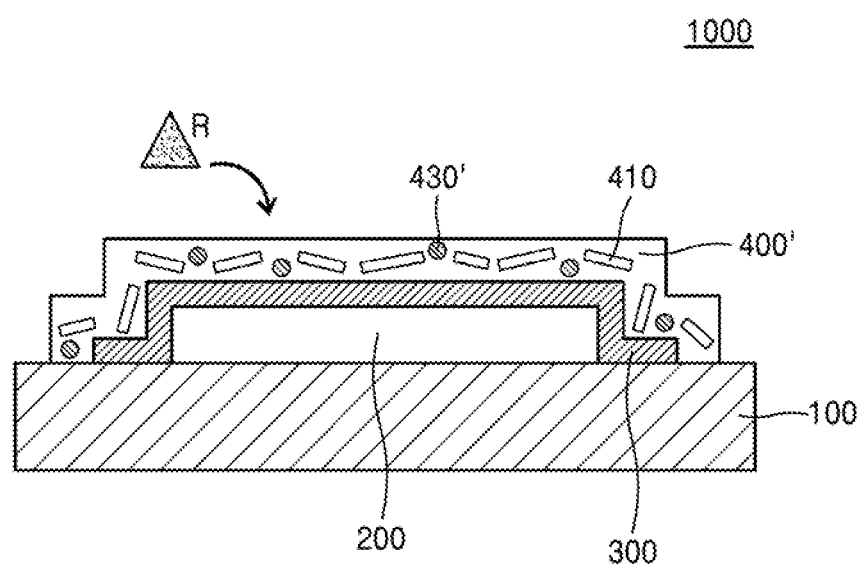

An operation of adding a reactant R may be performed as illustrated in FIG. 4C, for example. The reactant R may be added, the inorganic precursor 430' which has been injected into the free volume F of the organic layer 400' may react with the reactant, and the inorganic precursor 430'may be changed to the inorganic material.

When the inorganic layer 430' is trimethylaluminum (TMA, $[(CH_3)_3Al]_2$), the reactant R to be added may be $H_2O$ according to an exemplary embodiment of the present invention.

$[(CH_3)_3Al]_2$ may react with $H_2O$ and be changed to the inorganic material filling in the free volumes F.

Figure 4D:
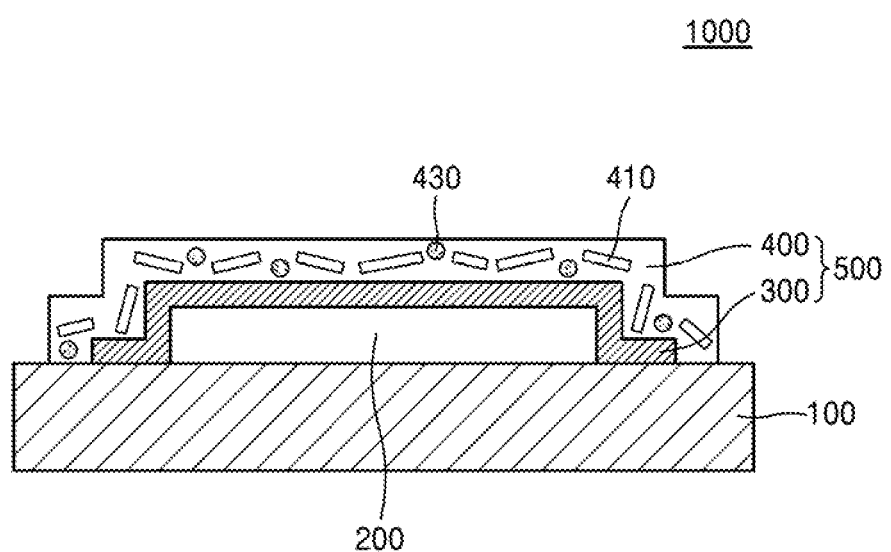

Referring to FIG. 4D, the inorganic precursor 430' may react with the reactant R, be changed to the inorganic material 430, fill in the free volumes F between organic layers 410, and form the barrier organic layer 400.

The inorganic material 430 filling in the free volumes F between organic layers 410 may be aluminum oxide ($Al_2O_3$) according to an exemplary embodiment of the present invention.

For example, $[(CH_3)_3Al]_2$ and the inorganic precursor 430' may react with the reactant R (e.g., $H_2O$) and be changed to the inorganic material 430 (e.g., $Al_2O_3$.

Thus, the barrier organic layer 400 including the plurality of organic materials 410 and the plurality of inorganic materials 430 arranged in free volumes F between organic materials 410 may be formed on the first inorganic layer 300, as illustrated in FIG. 4D, for example.

The top surface of the barrier organic layer 400 may be relatively rough, according to an exemplary embodiment of the present invention. The barrier organic layer 400 included in the display device 1000 according to one or more exemplary embodiments of the present invention may include and be formed of both organic materials and inorganic materials, and the top surface of the barrier organic layer 400 might not be slippery or smooth, but may be rough or rugged.

The top surface of the barrier organic layer 400 may be smooth or flat; however, exemplary embodiments of the present invention are not limited thereto. The top surface of the barrier organic layer 400 may be non-slippery, rough and rugged, as described above.

Accordingly, since the display device 1000 manufactured by the method of manufacturing the display device according to one or more exemplary embodiments of the present invention may have free volumes F, between organic materials 410, filled with inorganic materials 430, invasion paths for oxygen or moisture may be reduced or prevented. Thus, the barrier organic layer 400 may reduce or prevent a penetration of outside oxygen and moisture to the display unit 200.

Thus, the first inorganic layer 300 and the barrier organic layer 400 may protect the display unit 200. Thus, an additional inorganic layer on the barrier organic layer 400 need not be included in the barrier organic layer 400, and thus the overall thickness and flexibility of the display device according to exemplary embodiments of the present invention may be increased.

Since the barrier organic layer 400 may absorb the stress of the first inorganic layer 300 and provide flexibility, a separate inorganic layer on the barrier organic layer 400 may be omitted and an occurrence of a crack due to stress on the inorganic layer may be reduced or prevented.

Figure 5:
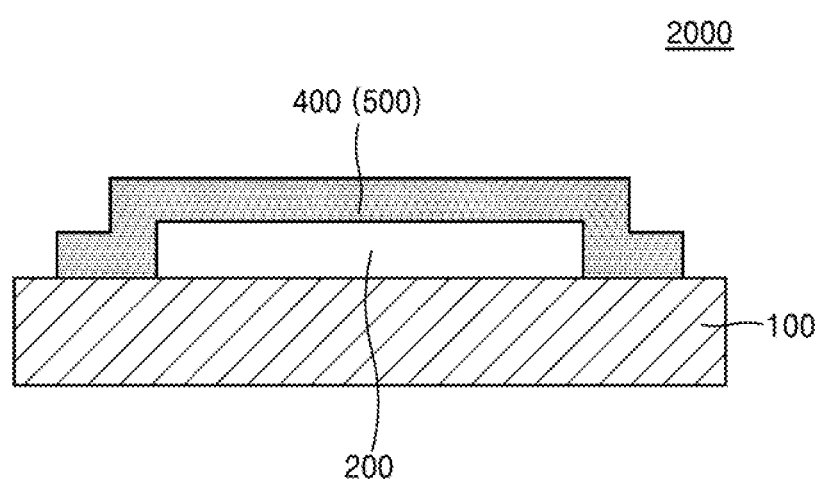
FIG. 5 is a cross-sectional view of a display device according to another exemplary embodiment of the present invention.

FIG. 5 is a cross-sectional view of a display device according to another exemplary embodiment of the present invention. In FIG. 5, like reference numerals as those illustrated in FIG. 2 may denote like elements, and thus duplicative descriptions may be omitted.

A display device 2000 may include the substrate 100, the display unit 200 disposed on the substrate 100 and the encapsulating unit 500 encapsulating the display unit 200 according to one or more exemplary embodiments of the present invention.

The encapsulating unit 500 may include the barrier organic layer 400 according to an exemplary embodiment of the present invention. The barrier organic layer 400 may be directly disposed on the display unit 200 and may reduce or prevent a penetration of outside oxygen or moisture to the display unit 200.

The barrier organic layer 400 may be disposed on the display unit 200 and both ends of the barrier organic layer 400 may be in direct contact with the substrate 100. The barrier organic layer 400 may encapsulate completely the display unit 200.

The display device 2000 according to one or more exemplary embodiments of the present invention may include the encapsulating unit 500, which may include the barrier organic layer 400, without including a separate inorganic layer either on or under the barrier organic layer 400.

The barrier organic layer 400 included in the encapsulating layer 500 may include both the organic material and the inorganic material.

The organic material included in the barrier organic layer 400 may include a polymer. The organic material may include, for example, a single layer or multiple layers including any one of PET, polyimide, PC, epoxy, polyethylene, and PAR.

For example, the organic material included in the barrier organic layer 400 may include PAR. The barrier organic layer 400 may include a polymerized monomer composition including a diacrylate monomer and a triacrylate monomer.

Referring to FIG. 4D, the barrier organic layer 400 may include the plurality of organic materials 410 and the plurality of inorganic materials 430 filing in gaps between organic materials 410.

Organic materials and inorganic materials included in the barrier organic layer 400 are not illustrated in the display device 2000 illustrated in FIG. 5; however, organic and inorganic materials included in the barrier organic layer 400 illustrated in FIG. 5 may be substantially the same as the barrier organic layer 400 illustrated in FIG. 4D.

Thus, since the barrier organic layer 400 may include free volumes F between organic materials 410, filled with inorganic materials 430, invasion paths for oxygen or moisture may be blocked, and thus a penetration of outside oxygen and moisture to the display unit 200 may be reduced or prevented.

Even though the encapsulating unit 500 may include the barrier organic layer 400, without a separate inorganic layer, the encapsulating unit 500 may reduce or prevent a penetration of moisture and oxygen to the display unit 200.

Thus, since the thickness of the encapsulating unit 500 may be relatively thin, the flexibility of the display device may be increased, even without a separate inorganic layer. Thus, an occurrence of a crack due to stress in the inorganic layer when the display device 2000 is deformed may be reduced or eliminated.

Since the barrier organic layer 400 may include organic materials, the encapsulating unit 500 and the display device 2000 may be relatively flexible.

Figure 6:
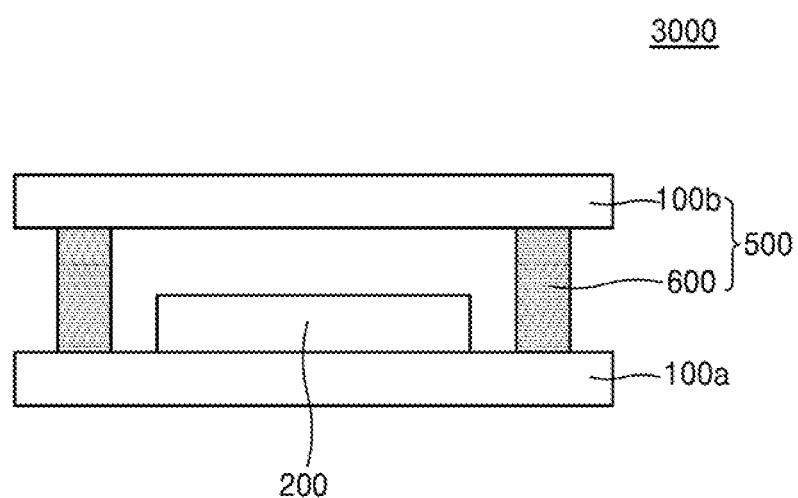
FIG. 6 is a cross-sectional view of a display device according to another exemplary embodiment of the present invention.

FIG. 6 is a cross-sectional view of a display device according to another exemplary embodiment of the present invention. In FIG. 6, like reference numerals as in FIGS. 1 through 5 may denote like elements, and duplicative descriptions may be omitted.

A display device 3000 may include a substrate 100A, the display unit 200 on the substrate 100A and the encapsulating unit 500 encapsulating the display unit 200. The encapsulating unit 500 may reduce or prevent a penetration of outside oxygen or moisture to the display unit 200.

The encapsulating unit 500 may include an encapsulating substrate 100B and the encapsulating material 600 according to an exemplary embodiment of the present invention. In some exemplary embodiments of the present invention, the encapsulating unit 500 may have a thin film encapsulation shape and may protect the display unit 200 as described above; however, the shape of the encapsulating unit 500 is not limited thereto, and the display device 3000 according to one or more exemplary embodiments of the present invention may include the encapsulating substrate 100B and the encapsulating material 600 having any desired shape.

The encapsulating material 600 may include the barrier organic layer 400 according to an exemplary embodiment of the present invention. The encapsulating material 600 may include inorganic materials and organic materials.

The encapsulating material 600 may include a plurality of organic materials and a plurality of inorganic materials arranged with free volumes between the organic materials, similar to the barrier organic layer 40 illustrated in FIG. 4D.

Accordingly, since the encapsulating material 600 may include free volumes filled with inorganic materials, invasion paths for oxygen or moisture may be blocked. Thus, the encapsulating material 600 may reduce or prevent a penetration of outside oxygen and moisture to the display unit 200. The encapsulating material may provide flexibility to the display unit 200 since the encapsulating material 600 may include organic materials.

Since the encapsulating material 600 may include the barrier organic layer 400, the flexibility of the display device may be increased. Thus, an occurrence of a crack when the display unit 200 is deformed may be reduced or prevented, and an invasion of outside moisture and oxygen to the display unit 200 may be reduced or prevented.

It should be understood that exemplary embodiments of the present invention described herein should be considered in a descriptive sense and not for purposes of limitation. Descriptions of features or aspects within each exemplary embodiment of the present invention should typically be considered as available for other similar features or aspects in other exemplary embodiments of the present invention.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
    a substrate;
    a display unit disposed on the substrate; and
    an encapsulating unit encapsulating the display unit,
    wherein the encapsulating unit comprises an inorganic layer disposed on the display unit, and a barrier organic layer disposed on the inorganic layer, wherein the inorganic layer comprises a first inorganic material,
wherein the barrier organic layer comprises an organic material and a second inorganic material, the second inorganic material is arranged in free volumes of the organic material,
wherein the first inorganic material comprises one of silicon nitride, silicon oxide and silicon oxynitride, wherein the second inorganic material comprises aluminum oxide.

2. The display device of claim 1, wherein the barrier organic layer includes one or more of PET, polyimide, PC, epoxy, polyethylene, and PAR.

3. The display device of claim 1, wherein the barrier organic layer includes a polymerized monomer composition including a diacrylate monomer and a triaerylate monomer.

4. The display device of claim 1, wherein the barrier organic layer comprises a rough top surface.

5. The display device of claim 1, wherein the barrier organic layer includes a photoinitiator.

6. A display device comprising:
a substrate;
a display unit disposed on the substrate; and
an encapsulating unit encapsulating the display unit,
wherein the encapsulating unit comprises an inorganic layer on the display unit and a barrier organic, layer on the inorganic layer,
wherein the inorganic layer comprises a first inorganic material,
wherein the barrier organic layer comprises an organic material and a second inorganic material, the second inorganic material is provided to fill a gap within the organic material,
wherein ends of the inorganic layer contact with the substrate, and
wherein a layer including the organic material of the barrier organic layer directly contacts the substrate.

7. The display device of claim 6, wherein the organic material include a polymer, wherein the first inorganic material comprises one of silicon nitride, silicon oxide and silicon oxynitride, wherein the second inorganic material comprises aluminum oxide.

8. The display device of claim 6, wherein the harder organic layer includes one or more of PET, polymide, PC, epoxy, polyethylene, and PAR.

9. The display device of claim 6, wherein the barrier organic layer includes a polymerized monomer composition including a diacrylate monomer and a triacrylate monomer.

10. The display device of claim 6, wherein the barrier organic layer comprises a rough top surface.

11. The display device of claim 6, wherein the display unit comprises an organic light-emitting diode (OLED)) and a thin-film transitor (TFT).

12. The display device of claim 11, wherein the barrier organic layer comprises a rough surface.

13. A display device comprising:
a substrate;
a display unit disposed on the substrate; and
an encapsulating unit encapsulating the display unit,
wherein the encapsulating unit comprises an inorganic layer on the display unit and a barrier organic layer on the inorganic layer,
wherein the inorganic layer comprises a first inorganic material,
wherein the barrier organic layer comprises an organic material and a second inorganic material,
wherein ends of the inorganic layer contact with the substrate, and
wherein the second inorganic material is arranged in free volumes of the organic material.

14. The display device of claim 13, wherein the organic material includes a polymer, wherein the first inorganic material comprises one of silicon nitride, silicon oxide and silicon oxynitride, wherein the second inorganic material comprises aluminum oxide.

15. The display device of claim 13, wherein the barrier organic layer includes one or more of PET, polyimide, PC, epoxy, polyethylene, and PAR.

16. The display device of claim 13, wherein the barrier organic layer includes a polymerized monomer composition including a diacrylate monomer and a triacrylate monomer.

17. The display device of claim 13, wherein the barrier organic layer comprises a rough top surface.

18. The display device of claim 13. wherein the display unit comprises an organic light-emitting diode (OLED) and a thin-film transistor (TFT).

19. The display device of claim 18, wherein the barrier organic layer comprises a rr ugh surface.

20. The display device of claim 13, wherein the barrier organic layer is an uppermost layer of the encapsulation film.

* * * * *

UNITED STATES PATENT AND TRADEMARK OFFICE
CERTIFICATE OF CORRECTION

PATENT NO. : 11,569,475 B2
APPLICATION NO. : 16/676816
DATED : January 31, 2023
INVENTOR(S) : Seungyong Song et al.

It is certified that error appears in the above-identified patent and that said Letters Patent is hereby corrected as shown below:

On the Title Page

(73) Assignee, please correct:
"SAMSUNG DISPLAY CO., LTD.,
Yongin-si (KR)"

To read:
--SAMSUNG DISPLAY CO., LTD.,
Yongin-si (KR)
Industry-University Cooperation Foundation Hanyang University,
Seoul (KR)--

Signed and Sealed this
Thirteenth Day of June, 2023

Katherine Kelly Vidal
*Director of the United States Patent and Trademark Office*